United States Patent
Xiang et al.

(10) Patent No.: US 6,924,182 B1
(45) Date of Patent: Aug. 2, 2005

(54) STRAINED SILICON MOSFET HAVING REDUCED LEAKAGE AND METHOD OF ITS FORMATION

(75) Inventors: Qi Xiang, San Jose, CA (US); Ming Ren Lin, Cupertino, CA (US); Minh V. Ngo, Fremont, CA (US); Eric N. Paton, Morgan Hill, CA (US); Haihong Wang, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 146 days.

(21) Appl. No.: 10/642,375

(22) Filed: Aug. 15, 2003

(51) Int. Cl.$^7$ ................. H01L 21/8234; H01L 21/76
(52) U.S. Cl. ........................... 438/197; 438/424
(58) Field of Search ................... 438/197, 424

(56) References Cited

U.S. PATENT DOCUMENTS

| | | | |
|---|---|---|---|
| 5,308,785 A * | 5/1994 | Comfort et al. | 438/429 |
| 6,646,322 B2 * | 11/2003 | Fitzgerald | 257/531 |
| 6,657,223 B1 * | 12/2003 | Wang et al. | 257/19 |
| 6,703,648 B1 * | 3/2004 | Xiang et al. | 257/192 |
| 6,730,576 B1 * | 5/2004 | Wang et al. | 438/413 |
| 6,831,292 B2 * | 12/2004 | Currie et al. | 257/19 |
| 6,846,720 B2 * | 1/2005 | Balasubramanian et al. | 438/424 |
| 6,849,527 B1 * | 2/2005 | Xiang | 438/528 |
| 6,852,600 B1 * | 2/2005 | Wang et al. | 438/301 |
| 2004/0180509 A1 * | 9/2004 | Wang et al. | 438/424 |
| 2005/0032327 A1 * | 2/2005 | Ohnishi et al. | 438/424 |

\* cited by examiner

Primary Examiner—David S. Blum
(74) Attorney, Agent, or Firm—Foley & Lardner LLP (57) ABSTRACT

The formation of shallow trench isolations in a strained silicon MOSFET includes performing ion implantation in the strained silicon layer in the regions to be etched to form the trenches of the shallow trench isolations. The dosage of the implanted ions and the energy of implantation are chosen so as to damage the crystal lattice of the strained silicon throughout the thickness of the strained silicon layer in the shallow trench isolation regions to such a degree that the etch rate of the strained silicon in those regions is increased to approximately the same as or greater than the etch rate of the underlying undamaged silicon germanium. Subsequent etching yields trenches with significantly reduced or eliminated undercutting of the silicon germanium relative to the strained silicon. This in turn substantially prevents the formation of fully depleted silicon on insulator regions under the ends of the gate, thus improving the MOSFET leakage current.

20 Claims, 7 Drawing Sheets

STRAINED SILICON MOSFET HAVING REDUCED LEAKAGE AND METHOD OF ITS FORMATION

BACKGROUND OF THE INVENTION

1. Field of the Invention

The present invention relates to semiconductor integrated circuits, and in particular to semiconductor devices that incorporate strained silicon.

2. Related Technology

The continuous demand for improved performance in electronic devices has been addressed through advances in silicon processing and device technologies directed toward reduction in the size of individual semiconductor circuit components. However, economic and physical constraints are making continued reduction of device sizes more difficult, and so alternative solutions are being sought to allow increases in device performance to continue.

One option for increasing the performance of MOSFETs is to enhance the carrier mobility of the MOSFET semiconductor material so as to reduce resistance and power consumption and to increase drive current, frequency response and operating speed. A method of enhancing carrier mobility that has become a focus of recent attention is the use of silicon material to which a tensile strain is applied. "Strained" silicon may be formed by growing a layer of silicon on a silicon germanium substrate. The silicon germanium lattice is more widely spaced on average than a pure silicon lattice because of the presence of the larger germanium atoms in the lattice. Since the atoms of the silicon lattice align with the more widely spaced silicon germanium lattice, a tensile strain is created in the silicon layer. The silicon atoms are essentially pulled apart from one another. The amount of tensile strain applied to the silicon lattice increases with the proportion of germanium in the silicon germanium lattice.

The tensile strain applied to the silicon lattice increases carrier mobility. Relaxed silicon has six equal valence bands. The application of tensile strain to the silicon lattice causes four of the valence bands to increase in energy and two of the valence bands to decrease in energy. As a result of quantum effects, electrons effectively weigh 30 percent less when passing through the lower energy bands. Thus the lower energy bands offer less resistance to electron flow. In addition, electrons encounter less vibrational energy from the nucleus of the silicon atom, which causes them to scatter at a rate of 500 to 1000 times less than in relaxed silicon. As a result, carrier mobility is dramatically increased in strained silicon as compared to relaxed silicon, offering a potential increase in mobility of 80% or more for electrons and 20% or more for holes. The increase in mobility has been found to persist for current fields of up to 1.5 megavolts/centimeter. These factors are believed to enable a device speed increase of 35% without further reduction of device size, or a 25% reduction in power consumption without a reduction in performance.

Figure 1:
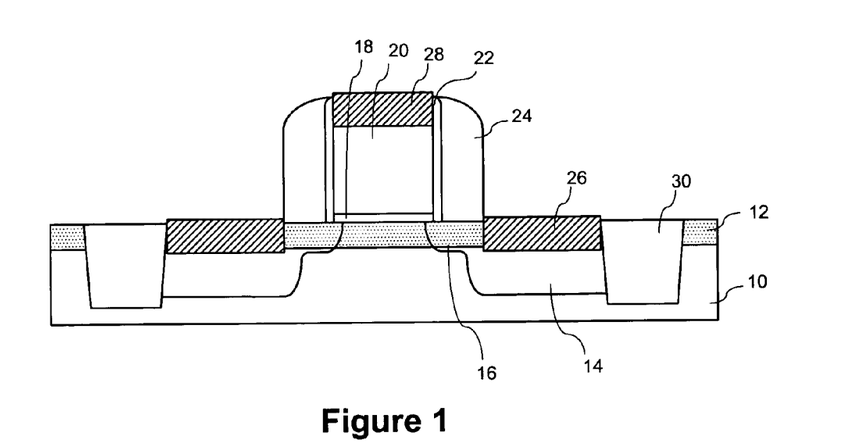
FIG. 1 shows a MOSFET using a layer of strained silicon formed in accordance with conventional processing.

An example of a MOSFET using a strained silicon layer is shown in FIG. 1. The MOSFET is fabricated on a substrate comprising a silicon germanium layer 10 on which is grown an epitaxial layer of strained silicon 12. The MOSFET uses conventional MOSFET structures including deep source and drain regions 14, shallow source and drain extensions 16, a gate oxide layer 18, a gate 20 surrounded by spacers 22, 24, silicide source and drain contacts 26, a silicide gate contact 28, and shallow trench isolations 30. The channel region of the MOSFET includes the strained silicon material, which provides enhanced carrier mobility between the source and drain.

Figure 2A:
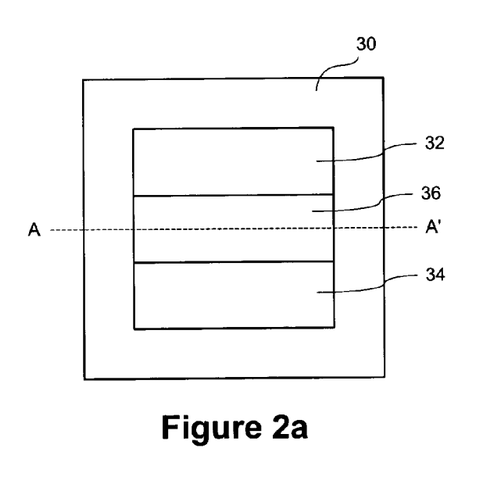
FIGS. 2a, 2b, 2c and 2d show additional views of the MOSFET of FIG. 1.
Figure 2B:
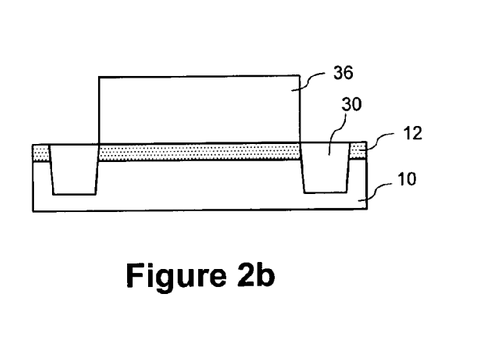

While the incorporation of strained silicon in MOSFETs enhances some aspects of MOSFET performance, other aspects of MOSFET performance are degraded. One source of performance degradation is a decrease in the threshold voltage Vt under the gate at the edges of the active area, which results in increased leakage current under the ends of the gate. The mechanism that produces this effect is explained with reference to FIGS. 2a–2d. FIG. 2a shows a generalized plan view of the strained silicon MOSFET of FIG. 1. In this view it is seen that the shallow trench isolations 30 surround an active area in which are formed a source region 32 and drain region 34. The gate structure 36 bisects the active area between the source region 32 and the drain region 34. FIG. 2b shows a cross section of the MOSFET of FIG. 2a taken along line A–A'. As shown in FIG. 2b, the gate structure 36 and the strained silicon layer 12 span the distance between the shallow trench isolations 30.

Figure 2C:
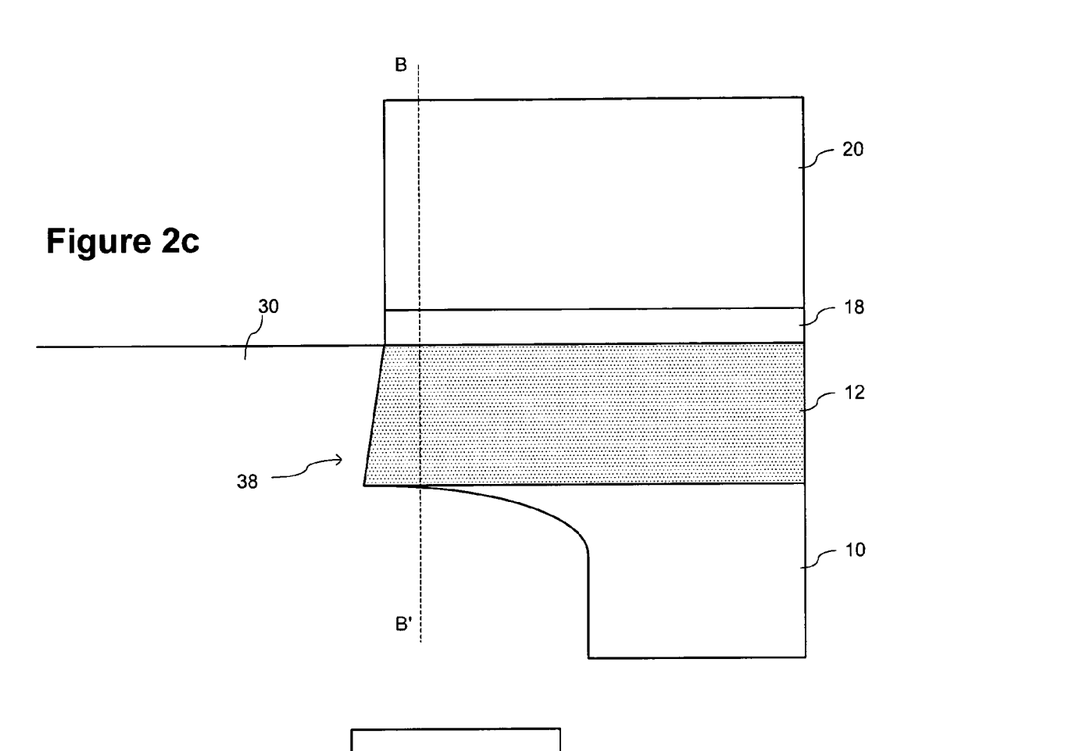
Figure 2D:
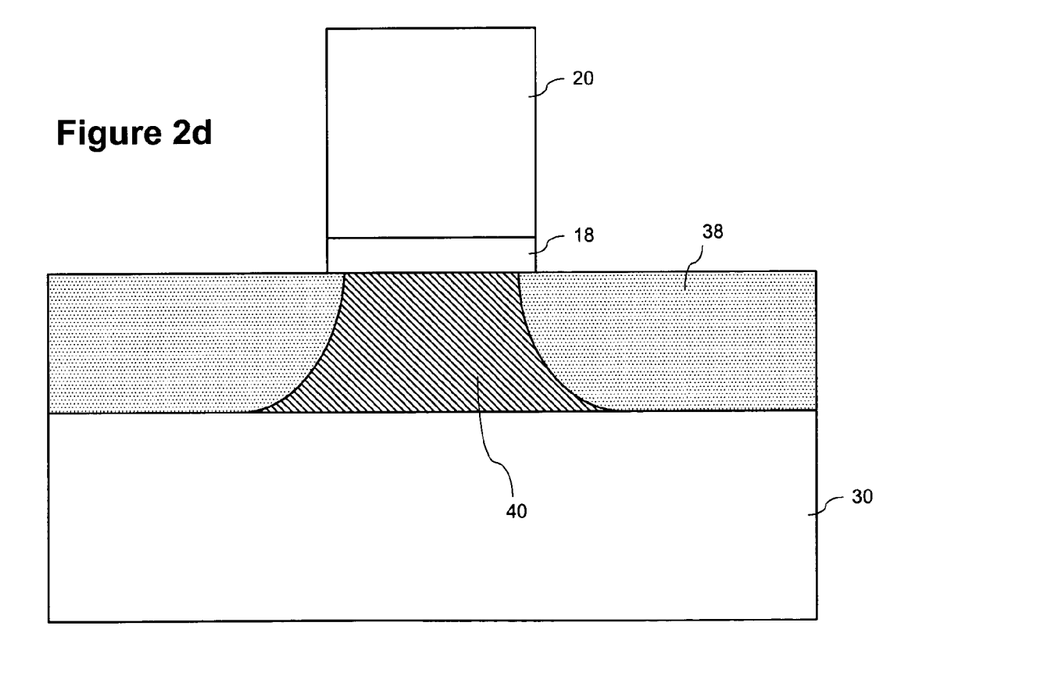

The view of FIG. 2b is idealized, in that the shallow trench isolations 30 are shown as having essentially linearly tapered sidewall profiles. However, in actual implementations such linearity is difficult to achieve using conventional processing. The difficulty arises from the differences in the etch rates of silicon and silicon germanium. Typically a single etch chemistry such as $HBr/Cl_2/He/O_2$ is used to etch both the strained silicon and the silicon germanium. However, this chemistry etches the material of the strained silicon layer 12 at a slower rate than the material of the silicon germanium layer 10. As a result, significant undercutting of the silicon germanium 10 may occur. As shown in FIG. 2c, this undercutting creates a strained silicon overhang portion 38. The strained silicon overhang portion 38 is sandwiched between the gate insulator 18 and the insulating material of the shallow trench isolation 30. FIG. 2d shows a cross section of the structure of FIG. 2c taken along line B–B'. As shown in FIG. 2d, the overhang portion 38 of the strained silicon layer effectively forms the channel region of a silicon on insulator (SOI) structure that is comprised of the gate 20, the gate insulator 18, and an SOI substrate consisting of the portion of the shallow trench isolation 30 that underlies the strained silicon overhang portion 38. Because the strained silicon layer is thin, typically 200 Angstroms or less, the depletion region 40 between the source and drain regions of the MOSFET extends through the entire thickness of the strained silicon overhang portion 38, resulting in a fully depleted silicon on insulator structure beneath each end of the gate. This is highly undesirable since the threshold voltage Vt in the region of the fully depleted SOI structure is significantly lower than the threshold voltage in the remainder of the MOSFET, resulting in unacceptable leakage current beneath the ends of the gate.

Therefore strained silicon MOSFETs fabricated in accordance with conventional technology gain the benefit of enhanced carrier mobility but are degraded by greater leakage current in the regions under the ends of the gate.

SUMMARY OF THE INVENTION

It is an object of the invention to provide a strained silicon MOSFET that incorporates strained silicon without substantially reducing the threshold voltage or increasing the leakage current in regions beneath the ends of the gate.

In accordance with embodiments of the invention, the formation of shallow trench isolations in a strained silicon MOSFET includes performing ion implantation in the strained silicon layer in the regions to be etched to form the trenches of the shallow trench isolations. The dosage of the implanted ions and the energy of implantation are chosen so as to damage the crystal lattice of the strained silicon throughout the thickness of the strained silicon layer in the shallow trench isolation regions to such a degree that the etch rate of the strained silicon in those regions is increased to be approximately the same as or higher than the etch rate of the underlying undamaged silicon germanium. Subsequent etching yields trenches with significantly reduced or eliminated overhang portions. Accordingly the detrimental fully depleted silicon on insulator structure of the conventional strained silicon MOSFET is significantly reduced or eliminated, thus improving the MOSFET leakage current.

In accordance with one embodiment of the invention, a MOSFET having reduced leakage current is fabricated. Initially a substrate is provided. The substrate includes a first layer of silicon germanium and a layer of strained silicon grown on the layer of silicon germanium. A mask is then provided on the layer of strained silicon. The mask exposes areas of the strained silicon layer in which shallow trench isolations are to be formed. In the preferred embodiment, the mask comprises a photoresist mask that is used to pattern a bi-layer hardmask having openings corresponding to the areas in which the shallow trench isolations are to be formed. Ion implantation is then performed to damage the strained silicon in the exposed areas. Etching of the strained silicon in the exposed areas and the silicon germanium beneath the exposed areas is then performed to form trenches in the strained silicon and silicon germanium. Shallow trench isolations are then formed in the trenches. A MOSFET comprising the strained silicon layer is then formed in an active area defined by the shallow trench isolations. The processing to form the MOSFET typically includes patterning of a gate and gate insulator, implantation of shallow source and drain extensions and deep source and drain regions, and formation of source, drain and gate silicides. Other processing may also be performed.

DESCRIPTION OF THE DRAWINGS

Embodiments of the invention are described in conjunction with the following drawings, in which.

DESCRIPTION OF PREFERRED EMBODIMENTS

Figure 3A:
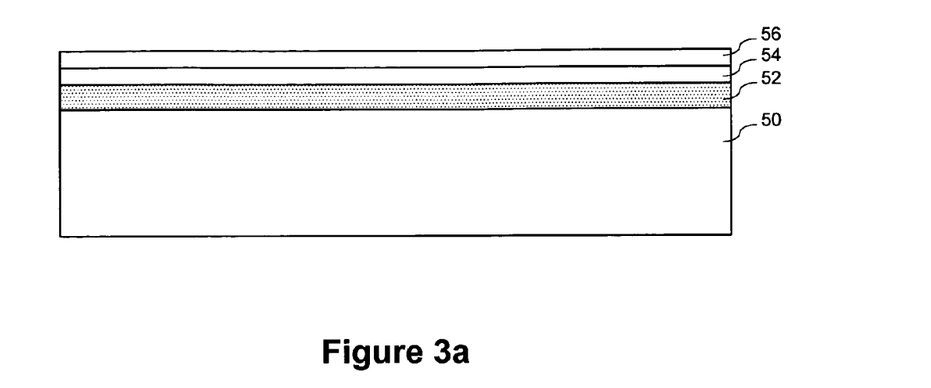
FIGS. 3a, 3b, 3c, 3d, 3e, 3f, 3g, 3h, 3i, 3j and 3k show structures formed during production of a MOSFET in accordance with a preferred embodiment of the invention.

FIGS. 3a–3k show structures formed during fabrication of a strained silicon MOSFET in accordance with a preferred embodiment of the invention. FIG. 3a shows a structure comprising a silicon germanium layer 50. The silicon germanium layer 50 preferably has a composition $Si_{1-x}Ge_x$, where x is approximately 0.2, and is more generally in the range of 0.1 to 0.3. The silicon germanium layer 50 is typically grown on and supported by a silicon wafer (not shown). Silicon germanium may be grown, for example, by chemical vapor deposition using $Si_2H_6$ (disilane) and $GeH_4$ (germane) as source gases, with a substrate temperature of 600–900 degrees C., a $Si_2H_6$ partial pressure of 30 mPa, and a $GeH_4$ partial pressure of 60 mPa. $SiH_4$ (silane) may be used in alternative processes. Growth of the silicon germanium layer 50 may be initiated using these ratios, or alternatively the partial pressure of $GeH_4$ may be gradually increased beginning from a lower pressure or zero pressure to form a gradient composition having the desired germanium content (e.g. 20%) at an upper portion that will form a junction with a later formed strained silicon layer.

A strained silicon layer 52 is grown on the silicon germanium layer 50. The strained silicon layer 52 is preferably grown by selective epitaxial growth through a chemical vapor deposition (CVD) process, for example using $Si_2H_6$ as a source gas with a partial pressure of 30 mPa and a substrate temperature of approximately 600 to 900 degrees C. The strained silicon layer 52 and the silicon germanium layer 50 are preferably grown in a single continuous in situ deposition process. This may be achieved by discontinuing the flow of germanium source gas (e.g. germane) into the deposition chamber after a desired thickness of silicon germanium has been grown in order to change the composition of the deposited material from silicon germanium to silicon.

Formed on the strained silicon layer 52 is a bi-layer hardmask structure comprising a bottom hardmask layer 54, also referred to as a bottom antireflective coating (BARC), and an upper hardmask layer 56. The bottom hardmask layer 54 is typically silicon oxide (e.g. $SiO_2$) and the upper hardmask layer 56 is typically silicon nitride (e.g. $Si_3N_4$).

Figure 3B:
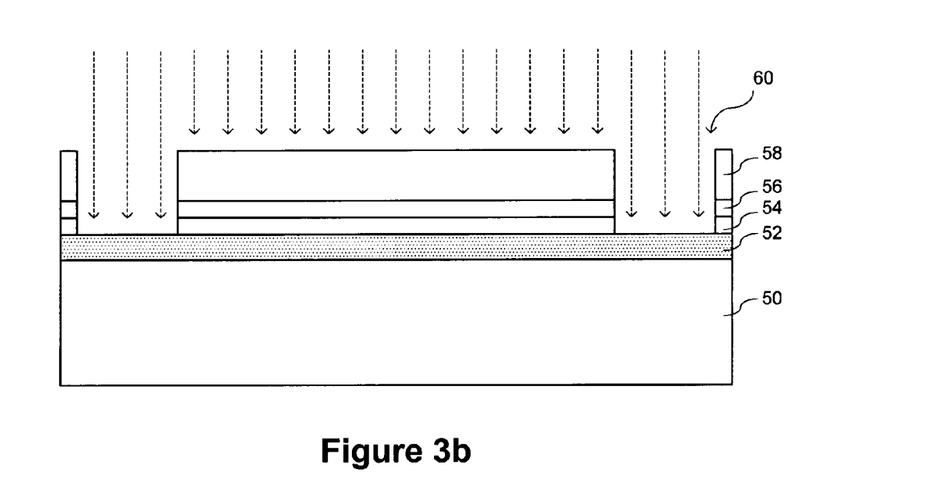

FIG. 3b shows the structure of FIG. 3a after patterning of the bi-layer hardmask using a photoresist mask 58 as an etch mask to form openings 60 in the bi-layer hardmask. The openings 60 correspond to the locations of shallow trench isolations to be formed in the strained silicon layer 52 and silicon germanium layer 50 to define active areas for formation of MOSFETs. As shown in FIG. 3b, after the openings 60 are formed, ion implantation is performed to damage the crystal lattice of the strained silicon layer 52. A variety of ions may be used in this process. Preferred ions include silicon, germanium, argon, xenon and nitrogen. The energy of implantation is chosen so that substantially the entire thickness of the strained silicon layer is damaged by the implantation. The dose is chosen so that the damage caused by the implantation increases the rate at which the strained silicon will be etched so that its etch rate is substantially the same as or greater than the etch rate of the underlying silicon germanium. In one example, a 150 angstrom strained silicon layer is damaged by performing ion implantation using xenon at an energy of 40 keV and a dose of $1 \times 10^{14}$ $cm^{-2}$. It is preferred to retain the photoresist mask 58 on top of the bi-layer hardmask during ion implantation to protect the bi-layer hardmask materials from the damaging effects of the implantation.

Figure 3C:
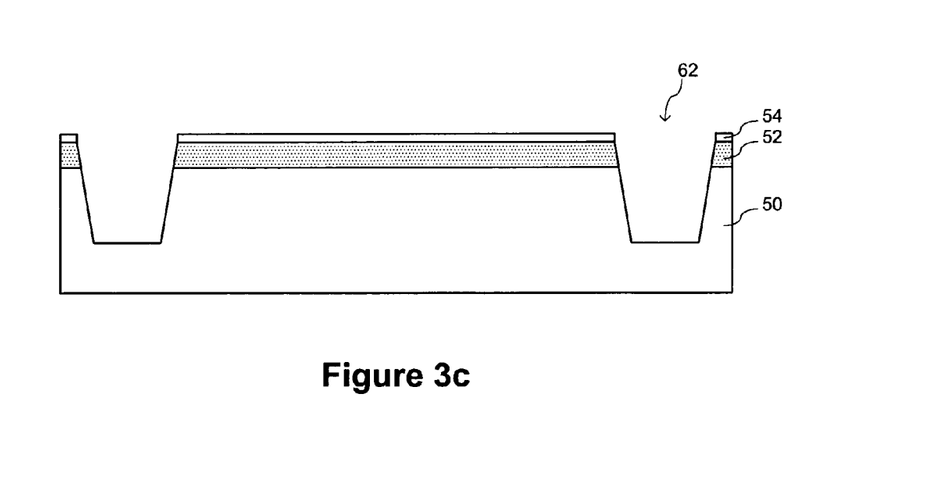

FIG. 3c shows the structure of FIG. 3b after etching of the strained silicon layer 52 and the silicon germanium layer 50 to form trenches 62 having tapered sidewalls. Because the etch rate of the strained silicon layer 52 is made to be approximately the same as or greater than the silicon germanium layer 50 as a result of the damage caused by ion implantation, relatively little undercutting of the silicon germanium occurs. Therefore the formation of a fully depleted silicon on insulator structure at the edges of the shallow trench isolations is avoided. As shown in FIG. 3c, the etching process tends to consume some of the material of the bi-layer hardmask, typically leaving a portion of the bottom silicon oxide layer 54.

It may be desirable at this stage of processing to perform an angled implant on the trench sidewalls to introduce a dopant that increases the threshold voltage Vt in any overhang regions. The implanted dopant is chosen to be of the same conductivity type as that of the channel region dopant. For example, in NMOS devices it is preferred to use boron, while in PMOS devices it is preferred to use arsenic. The energy of implantation is preferably chosen to penetrate the strained silicon layer 52 and silicon germanium layer 50 to a depth sufficient to dope any portion of those layers that will overhang the shallow trench isolations and otherwise be in a fully depleted state.

Figure 3D:
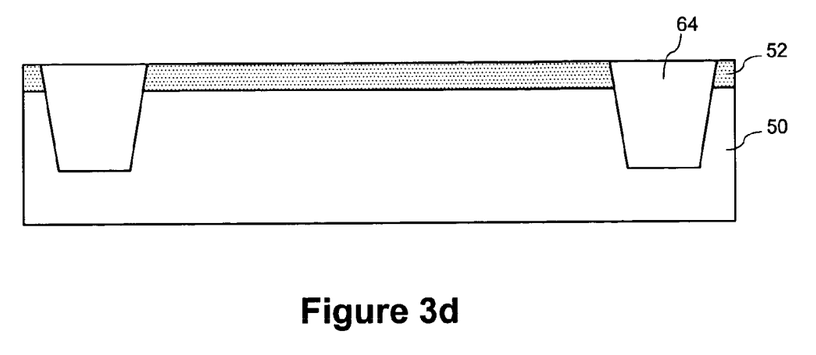

FIG. 3d shows the structure of FIG. 3c after formation of shallow trench isolations 64 in the trenches. The shallow trench isolations may be formed by performing a brief thermal oxidation of the exposed stained silicon and silicon germanium in the trenches, followed by deposition of a layer of silicon oxide to a thickness that is sufficient to fill the trenches, such as by low pressure CVD (LPCVD) TEOS or atmospheric pressure ozone TEOS. The silicon oxide layer is then densified, and an overburden portion is removed such as by chemical mechanical polishing or an etch back process, leaving shallow trench isolations 64 that are approximately level with the surface of the strained silicon layer 52. Where only silicon oxide material remains from the bi-layer hardmask after etching of the trenches, the silicon oxide layer for the shallow trench isolations may be deposited directly over the residual silicon oxide hardmask material. Where material of the upper layer of the bi-layer hardmask such as silicon nitride remains after etching of the trenches, it may be preferred to remove at least the silicon nitride prior to deposition of silicon oxide in order to simplify later removal of the silicon oxide overburden by chemical mechanical polishing or etch back.

Figure 3E:
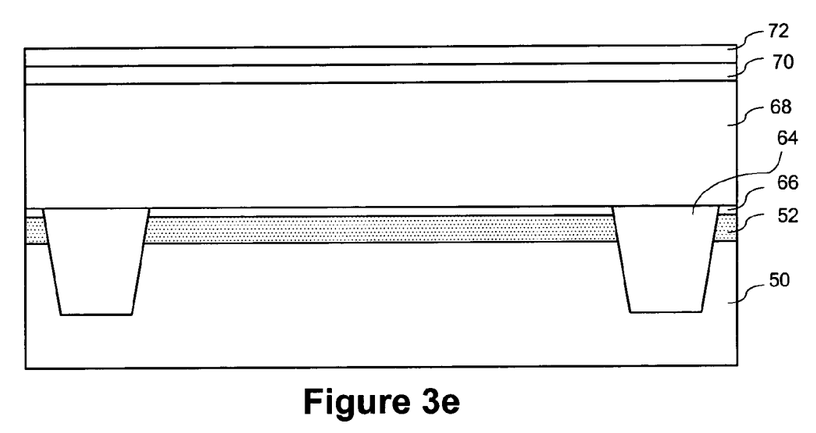

FIG. 3e shows the structure of FIG. 3d after formation of several layers of different materials over the strained silicon layer 52. The layers of material that are formed include a gate insulating layer 66 that is formed on the strained silicon layer 52. The gate insulating layer 66 is typically silicon oxide but may be another material such as silicon oxynitride. An oxide may be grown by thermal oxidation of the strained silicon layer 52, or may be deposited by chemical vapor deposition. Formed over the gate insulating layer 66 is a gate conductive layer 68. The gate conductive layer 68 typically comprises polysilicon but may alternatively comprise another material such as polysilicon implanted with germanium. Overlying the gate conductive layer 68 is a bi-layer hardmask structure comprising a bottom hardmask layer 70, also referred to as a bottom antireflective coating (BARC), and an upper hardmask layer 72. The bottom hardmask layer 70 is typically silicon oxide (e.g. $SiO_2$) and the upper hardmask layer 72 is typically silicon nitride (e.g. $Si_3N_4$).

Figure 3F:
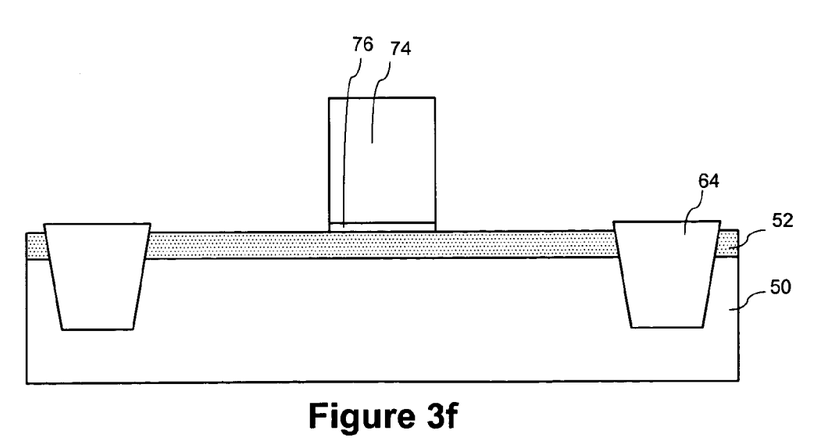

FIG. 3f shows the structure of FIG. 3e after patterning of the gate conductive layer and gate insulating layer to form a gate 74 and a self-aligned gate insulator 76. Patterning is performed using a series of anisotropic etches that patterns the upper hardmask layer using a photoresist mask as an etch mask, then patterns the lower hardmask layer using the patterned upper hardmask layer as an etch mask, then patterns the gate conductive layer using the patterned lower hardmask layer as an etch mask.

Figure 3G:
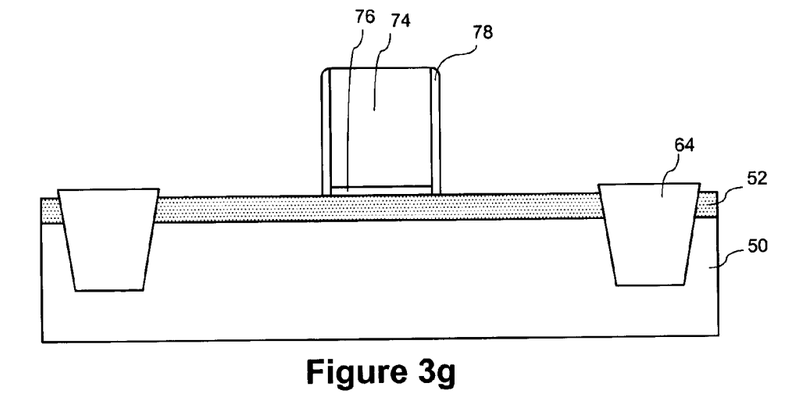

FIG. 3g shows the structure of FIG. 3f after formation of a thin first gate spacer 78 around the gate 74 and gate insulator 76. The thin first gate spacer 78 may be formed by oxidizing exposed silicon and polysilicon materials, and may oxidize a portion of the strained silicon layer 52 to form a protective oxide over the strained silicon.

Figure 3H:
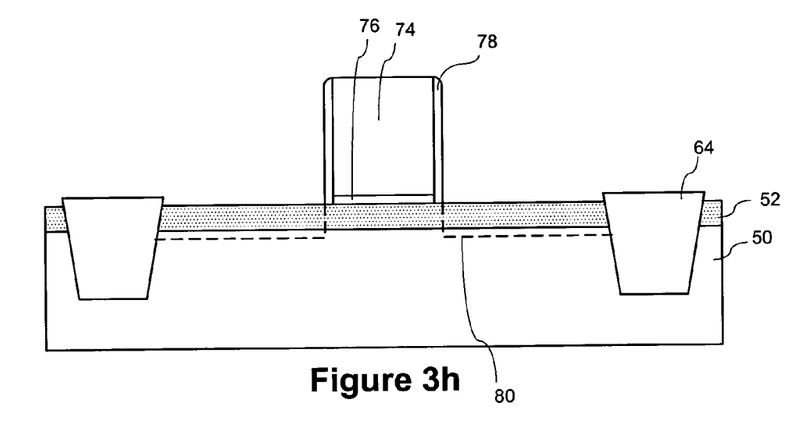

FIG. 3h shows the structure of FIG. 3g after implantation of dopant to form shallow source and drain extensions 80 in the strained silicon layer 52 at opposing sides of the channel region. The shallow source and drain extensions 80 typically extend into the silicon germanium layer 50 as shown in FIG. 3h. Halo regions (not shown) may be implanted prior to implantation of the shallow source and drain extensions. Halo regions are regions that are doped with a dopant that is opposite in conductivity to the dopant of the source and drain extensions 80. The halo regions help to suppress the short channel "punchthrough" effect by shortening the depletion regions at the ends of the source and drain extensions 80. The halo regions are preferably implanted using a low energy at a small angle to the surface of the substrate so that the halo regions extend beneath the gate 74 to beyond the anticipated locations of the ends of the source and drain extensions 80 after annealing. Like the source and drain extensions 80, the halo regions are formed at opposing sides of the channel region and extend toward the channel region beyond the ends of the source and drain extensions to be formed.

Figure 3I:
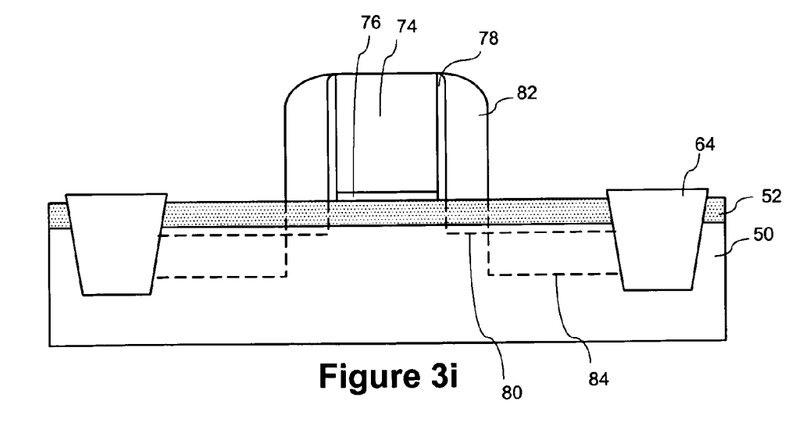

FIG. 3i shows the structure of FIG. 3h after formation of a second spacer 82 around the gate 74, the gate insulator 76, and the thin first spacer 78, followed by implantation of dopant to form deep source and drain regions 84 in the strained silicon 52 and silicon germanium 50 layers. The second spacer 82 serves as an implant mask during implantation of the deep source and drain regions 84 to define the position of the source and drain regions 84 relative to the channel region of the MOSFET. The depth of the deep source and drain regions 84 extends beyond the strained silicon layer 52 into the silicon germanium layer 50.

Figure 3J:
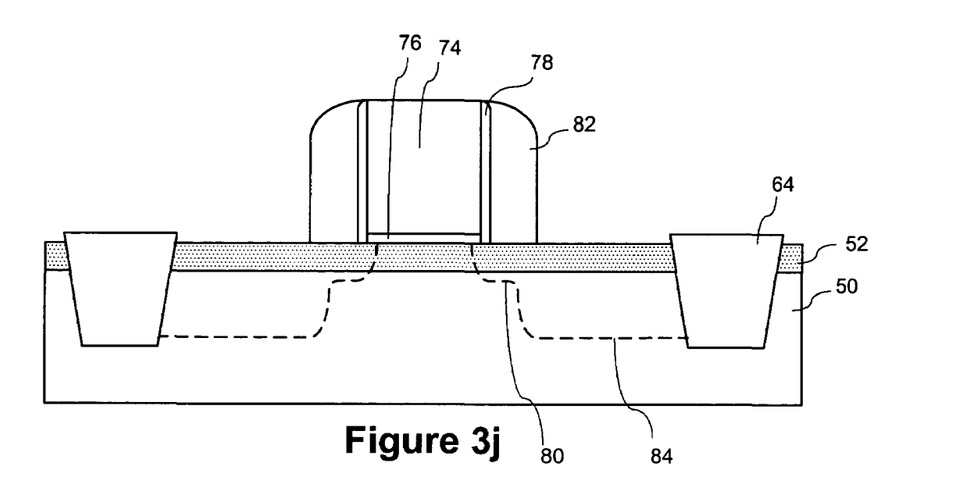

FIG. 3j shows the structure of FIG. 3i after performing rapid thermal annealing (RTA) to anneal the strained silicon layer 52 and silicon germanium layer 50 and to activate the dopants implanted in the shallow source and drain extensions 80 and the deep source and drain regions 84. During annealing some diffusion of implanted dopant occurs in the strained silicon layer 52 and the silicon germanium layer 50.

Figure 3K:
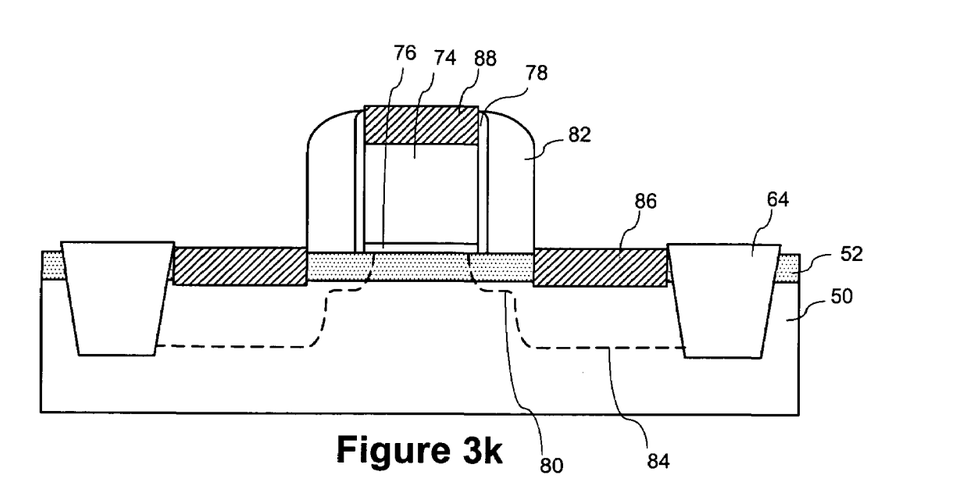

FIG. 3k shows the structure of FIG. 3i after formation of silicide contacts 86 on the source and drain regions 84 and formation of a silicide contact 88 on the gate 74. The silicide contacts are formed of a compound comprising a semiconductor material and a metal. Typically a metal such as cobalt (Co) is used, however other metals such as nickel (Ni) may also be employed. The silicide contacts are formed by depositing a thin conformal layer of the metal over the substrate, and then annealing to promote silicide formation at the points of contact between the metal and underlying semiconductor materials, followed by removal of residual metal.

While the processing of FIGS. 3a–3k is presently preferred, such processing does not exclude other additional processing that may be desirable in order to further enhance the performance of the strained silicon MOSFET. For example, in some applications it may be desired to grow a second layer of silicon germanium over the layer of strained silicon prior to or after formation of the shallow trench isolations in order to provide additional support of the tensile strain of the strained silicon layer and to resist the creation of misfit dislocations. This may facilitate the growth of strained silicon layers that are thicker than the conventional thickness of strained silicon that can be maintained on a single silicon germanium layer without substantial defects. In addition, in PMOS devices, it may be desirable to replace the strained silicon of the source and drain regions with silicon germanium in order to avoid source and drain extension distortions caused by the increased diffusion rate of boron in silicon. Similarly, it may be desirable in NMOS devices to replace a portion of the silicon germanium layer encompassing the source and drain extensions with silicon in order to avoid source and drain extension distortions caused by the increased diffusion rate of arsenic in silicon germanium. The use of additional halo regions to encompass the shallow source and drain extensions and deep source and drain regions may also be employed to counteract undesirable diffusion. It may also be desirable to replace the silicon germanium that encompasses the deep source and drain regions with silicon in order to increase the junction voltage in those regions and reduce the parasitic capacitance of the device. Other types of processing may also be integrated with the processing of the preferred embodiment.

Figure 4:
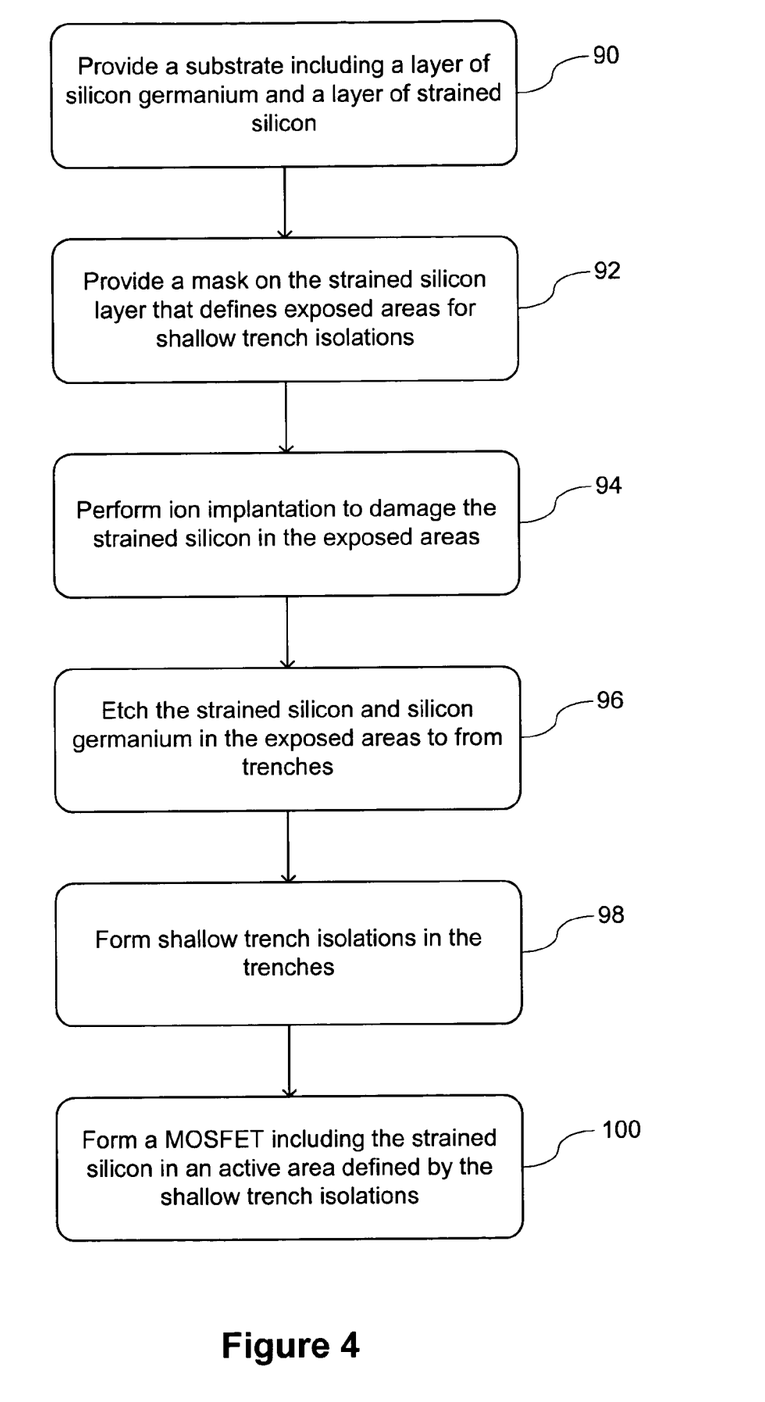
FIG. 4 shows a process flow encompassing the preferred embodiment and alternative embodiments.

FIG. 4 shows a process flow for forming a semiconductor device that encompasses the preferred embodiment of FIGS. 3a–3k, the aforementioned additional processing and other alternatives. Initially a substrate is provided (90). The substrate includes a first layer of silicon germanium and a layer of strained silicon grown on the layer of silicon germanium. A mask is then provided on the layer of strained silicon (92). The mask exposes areas of the strained silicon layer in which shallow trench isolations are to be formed. In the preferred embodiment, the mask comprises a photoresist mask that is used to pattern a bi-layer hardmask having openings corresponding to the areas in which the shallow trench isolations are to be formed. Ion implantation is then performed to damage the strained silicon in the exposed areas (94). Etching of the strained silicon in the exposed areas and the silicon germanium beneath the exposed areas is then performed to form trenches in the strained silicon and silicon germanium (96). Shallow trench isolations are then formed in the trenches (98). A MOSFET comprising the strained silicon layer is then formed between shallow trench isolations (100). The processing to form the MOSFET typically includes patterning of a gate and gate insulator, implantation of shallow source and drain extensions and deep source and drain regions, and formation of source, drain and gate silicides. Other processing may also be performed.

It will be apparent to those having ordinary skill in the art that the tasks described in the above processes are not necessarily exclusive of other tasks, but rather that further tasks may be incorporated into the above processes in accordance with the particular structures to be formed. For example, intermediate processing tasks such as formation and removal of passivation layers or protective layers between processing tasks, formation and removal of photoresist masks and other masking layers, doping and counter-doping, cleaning, planarization, and other tasks, may be performed along with the tasks specifically described above. Further, the process need not be performed on an entire substrate such as an entire wafer, but rather may be performed selectively on sections of the substrate. Thus, while the embodiments illustrated in the figures and described above are presently preferred, it should be understood that these embodiments are offered by way of example only. The invention is not limited to a particular embodiment, but extends to various modifications, combinations, and permutations that fall within the scope of the claimed inventions and their equivalents.

What is claimed is:

1. A method of fabricating a metal oxide semiconductor field effect transistor (MOSFET), comprising:
    providing a substrate comprising a layer of strained silicon grown on a layer of silicon germanium;
    providing a mask on the strained silicon layer that defines exposed areas in which shallow trench isolations are formed;
    performing ion implantation in the exposed areas to damage the strained silicon in the exposed areas;
    etching the strained silicon and the silicon germanium in the exposed areas to form trenches;
    forming shallow trench isolations in the trenches; and
    forming a MOSFET comprising the strained silicon layer in an active area defined by the shallow trench isolations.

2. The method claimed in claim 1, wherein ion that is implanted to damage the strained silicon is one of silicon, germanium, argon, xenon and nitrogen.

3. The method claimed in claim 1, wherein the first silicon germanium layer has a composition $Si_{1-x}Ge_x$, where x is in the range of 0.1 to 0.3.

4. The method claimed in claim 1, wherein forming said MOSFET comprises:
    forming a gate insulating layer on the strained silicon layer;
    forming a gate conductive layer on the gate insulating layer;
    patterning the gate conductive layer and the gate insulating layer to form a gate overlying a gate insulator.

5. The method claimed in claim 4, wherein forming said MOSFET further comprises:
    forming a first spacer around the gate and gate insulator; and
    implanting shallow source and drain extensions.

6. The method claimed in claim 5, wherein implanting shallow source and drain extensions is preceded by implanting halo regions, the halo regions extending toward a channel region beyond ends of the source and drain extensions to be formed, the halo regions comprising a dopant having a conductivity type opposite to the conductivity type of a dopant of the source and drain extensions.

7. The method claimed in claim 6, wherein forming the MOSFET further comprises:
    forming a second spacer around the first spacer; and
    implanting deep source and drain regions,
    wherein the second spacer serves as an implantation mask during implanting of the deep source and drain regions.

8. The method claimed in claim 7, wherein forming the MOSFET further comprises:
    forming silicide source and drain contacts and a silicide gate contact.

9. The method claimed in claim 8, wherein the silicide source and drain contacts and the silicide gate contact comprise nickel.

10. The method claimed in claim 8, wherein forming silicide source and drain contacts and a silicide gate contact is preceded by annealing to activate implanted dopants.

11. The method claimed in claim 1, wherein providing the substrate comprises growing layer of silicon germanium on a semiconductor substrate.

12. The method claimed in claim 11, further comprises growing a layer of strained silicon on the layer of silicon germanium.

13. The method claimed in claim 12, wherein the layer of silicon germanium and the layer of strained silicon are grown together in a single continuous in situ deposition process.

14. The method claimed in claim 1, wherein said mask comprises a bi-layer hardmask.

15. The method claimed in claim 14, wherein the mask comprises a photoresist mask that is left in place during said ion implantation.

16. The method claimed in claim 1, wherein providing said mask comprises
   forming a layer of silicon oxide on the layer of strained silicon; and
   forming a layer of silicon nitride on the layer of silicon oxide.

17. The method claimed in claim 16, wherein providing the mask further comprises:
   patterning the layer of silicon nitride and the layer of silicon oxide using a photoresist mask.

18. The method claimed in claim 17, wherein the photoresist mask is left on the layer of silicon nitride during said ion implantation.

19. A method of fabricating a metal oxide semiconductor field effect transistor (MOSFET), comprising:
   providing a substrate comprising a layer of strained silicon grown on a layer of silicon germanium;
   providing a mask on the strained silicon layer that defines exposed areas in which shallow trench isolations are formed, the mask comprising a bi-layer hardmask and a photoresist mask;
   performing ion implantation in the exposed areas to damage the strained silicon in the exposed areas, wherein the photoresist mask is left in place during said ion implantation to protect said bi-layer hardmask;
   etching the strained silicon in the exposed areas and the silicon germanium layer beneath the exposed areas to form trenches;
   forming shallow trench isolations in the trenches; and
   forming a MOSFET comprising the strained silicon layer in an active area defined by the shallow trench isolations.

20. A method of fabricating a metal oxide semiconductor field effect transistor (MOSFET), comprising:
   providing a substrate comprising a layer of strained silicon grown on a layer of silicon germanium;
   etching the strained silicon layer and the silicon germanium layer to form trenches;
   forming shallow trench isolations in the trenches;
   forming a gate and gate insulator on the strained silicon layer;
   implanting shallow source and drain extensions;
   implanting deep source and drain regions; and
   forming silicides on the gate and the source and drain regions,
   wherein etching of the strained silicon layer and silicon germanium layer to form trenches is preceded by implanting ions in the strained silicon in the regions of said trenches to reduce undercutting of the silicon germanium layer during etching of said trenches.

* * * * *